US008502368B2

(12) United States Patent
Gillingham

(10) Patent No.: US 8,502,368 B2

(45) Date of Patent: Aug. 6, 2013

(54) MULTI-CHIP PACKAGE WITH OFFSET DIE STACKING

(75) Inventor: Peter B Gillingham, Kanata (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 135 days.

(21) Appl. No.: 13/042,571

(22) Filed: Mar. 8, 2011

(65) Prior Publication Data

US 2012/0056335 A1 Mar. 8, 2012

Related U.S. Application Data

(60) Provisional application No. 61/315,111, filed on Mar. 18, 2010.

(51) Int. Cl.

*H01L 23/48* (2006.01)

*H01L 23/52* (2006.01)

(52) U.S. Cl.

USPC .... 257/686; 257/777; 257/784; 257/E23.024; 257/E23.085; 257/773

(58) Field of Classification Search

USPC .................. 257/686, 784, E23.024, E23.085

See application file for complete search history.

(56) References Cited

U.S. PATENT DOCUMENTS

| | | | | |
|---|---|---|---|---|
| 6,558,978 | B1 | 5/2003 | McCormick | |
| 6,563,205 | B1 * | 5/2003 | Fogal et al. | 257/686 |
| 7,095,117 | B2 * | 8/2006 | Suwa et al. | 257/738 |
| 7,115,972 | B2 * | 10/2006 | Dotta et al. | 257/621 |
| 7,498,667 | B2 * | 3/2009 | Ha et al. | 257/686 |
| 7,777,347 | B2 * | 8/2010 | Kuroda | 257/777 |
| 7,859,119 | B1 * | 12/2010 | St. Amand et al. | 257/777 |
| 7,944,036 | B2 * | 5/2011 | Sasaki | 257/686 |
| 7,952,183 | B2 * | 5/2011 | Okada et al. | 257/686 |
| 8,237,291 | B2 * | 8/2012 | Kim | 257/777 |
| 8,253,232 | B2 * | 8/2012 | Kim et al. | 257/686 |
| 2002/0195697 | A1 * | 12/2002 | Mess et al. | 257/686 |
| 2003/0183917 | A1 | 10/2003 | Tsai et al. | |
| 2004/0021230 | A1 | 2/2004 | Tsai et al. | |
| 2006/0087013 | A1 | 4/2006 | Hseih | |
| 2006/0091518 | A1 * | 5/2006 | Grafe et al. | 257/686 |
| 2007/0117266 | A1 | 5/2007 | Ball | |
| 2007/0241442 | A1 * | 10/2007 | Ha et al. | 257/686 |
| 2008/0171405 | A1 | 7/2008 | Yee et al. | |
| 2008/0230888 | A1 * | 9/2008 | Sasaki | 257/686 |
| 2010/0109143 | A1 * | 5/2010 | Cho | 257/690 |
| 2010/0283140 | A1 * | 11/2010 | Kim et al. | 257/686 |

* cited by examiner

*Primary Examiner* — Nitin Parekh

(74) *Attorney, Agent, or Firm* — Harvey Auerback

(57) ABSTRACT

A semiconductor device has a plurality of stacked semiconductor dice mounted on a substrate. Each die has similar dimensions. Each die has a first plurality of bonding pads arranged along a bonding edge of the die. A first group of the dice are mounted to the substrate with the bonding edge oriented in a first direction. A second group of the dice are mounted to the substrate with the bonding edge oriented in a second direction opposite the first direction. Each die is laterally offset in the second direction relative to the remaining dice by a respective lateral offset distance such that the bonding pads of each die are not disposed between the substrate and any portion of the remaining dice in a direction perpendicular to the substrate. A plurality of bonding wires connects the bonding pads to the substrate. A method of manufacturing a semiconductor device is also disclosed.

7 Claims, 10 Drawing Sheets

MULTI-CHIP PACKAGE WITH OFFSET DIE STACKING

RELATED APPLICATIONS

This application claims priority to U.S. Provisional Application Ser. No. 61/315,111, the contents of which is hereby incorporated herein by reference in its entirety.

FIELD OF THE INVENTION

The invention relates generally to semiconductor memory devices.

BACKGROUND

The use of semiconductor integrated circuit chips for data storage, such as portable flash memory cards, is widespread. Users of these devices desire ever-increasing data storage capacity, and manufacturers strive to provide a large storage capacity in a cost-effective manner, often while maintaining a standard package size to ensure compatibility with existing electronic devices.

It is known to achieve an increased memory density within a single package by stacking multiple semiconductor dice in a single package, known as a Multi-Chip Package (MCP). The increased number of dice provides a corresponding increase in storage capacity relative to a single die. Referring to FIG. 1, the MCP 100 consists of four NAND Flash memory dice 102. It should be understood that this method is equally applicable to other types of memory devices. Each die 102 has bonding pads 104 that are electrically connected via bond wires 106 to a common substrate 108. Although the dice 102 are shown with bonding pads 104 on two opposite sides, it should be understood that each die 102 may alternatively have a different arrangement of bonding pads 104, for example on a single side, or on two adjacent sides, or any other arrangement. The substrate 108 provides further electrical connections from the bond wires 106 to solder balls 110 on the opposite side of the substrate 108, forming a Ball Grid Array (BGA) for connection to an external device (not shown). An interposer 112 is provided between each pair of consecutive dice 102, to create a sufficient clearance therebetween to allow the attachment of the bond wires 106 to the bonding pads 104. This arrangement has the drawback that the thickness of the interposers 112 limits the number of dice 102 that can be stacked within a package of fixed dimensions, thereby limiting the total storage capacity of the MCP 100. In addition, because each die 102 overhangs the bonding pads 104 of the lower dice 102, the bond wires 106 for each die 102 must be attached prior to stacking the next die 102, resulting in an increased number of manufacturing steps and a time-consuming and labor-intensive assembly.

Another approach is shown in FIG. 2. The MCP 200 consists of four NAND Flash memory dice 202 with bonding pads 204 along one side. This arrangement may alternatively be used with dice 202 having bonding pads 204 along two adjacent sides, as will be discussed below in further detail. The dice 202 are laterally offset from one another to expose the bonding pads 204 of each die 202. In this arrangement, all of the dice 202 can be stacked in a single step, and thereafter all of the bond wires 206 can be attached in a single step by a wire bonding machine (not shown). This arrangement does not require interposers to provide access to the bonding pads 204, resulting in a more compact arrangement. This arrangement has the drawback that all of the bond wires 206 for all dice 202 must be attached along the same side(s) of the dice 202 and to the same surface of the substrate 208. The resulting high interconnect density may be congested and present logistic difficulties, particularly in devices such as HLNAND™ flash memory devices where each die 202 requires separate interconnect traces on the substrate 208. These can be addressed by providing additional interconnection layers on the substrate 208, which can increase the cost of manufacture.

Another approach is shown in FIG. 3. The MCP 300 consists of four NAND flash memory dice 302A, 302B, 302C, 302D in a staggered arrangement. The dice 302A, 302C have bonding pads 304 oriented along the left side, and the dice 302B, 302D have bonding pads 304 oriented along the right side. The lateral offset between consecutive dice 302 exposes the bonding pads 304, and the thickness of the dice 302 provides a sufficient clearance to attach the bond wires 306. For example, the die 302B provides a sufficient clearance between the dice 302A and 302C to attach bond wires 306 to the bonding pads 304 of the die 302A. The interconnect congestion of the substrate 308 is mitigated by the alternating orientation of the bonding pads 304, which allows half of the interconnections to be positioned on either side of the stack. However, this arrangement has the drawback that the bond wires 306 cannot all be attached in a single manufacturing step, because the dice 302C and 302D respectively overhang and block access to the bonding pads 304 of the dice 302A and 302B. In addition, the thickness of the dice 302B and 302C must provide a sufficient clearance to attach the bond wires 306 to the dice 302A and 302B, respectively. The clearance required is typically on the order of 100 microns. Although thinner dice 302 can be manufactured, they cannot be used without spacers in this arrangement to reduce the total height of the stack, thereby limiting the number of dice 302 that can be stacked in a package of fixed dimensions. As a result, the total storage capacity of the MCP 300 is limited and cannot be further improved by reducing the thickness of the dice 302.

Another approach is shown in FIG. 4. The MCP 400 consists of three NAND flash memory dice 402A, 402B, 402C, each with bonding pads 404 arranged on two opposite sides thereof. Each die 402 is sufficiently shorter in length than the die 402 immediately below it that it does not overlap the bonding pads 404 of the lower die 402. In this arrangement, all of the bonding pads 404 are accessible to attach the bond wires 406 in a single step for connection to the substrate 408. One drawback of this arrangement is that the dice 402 cannot all be made the same size, resulting in increased manufacturing complexity. In addition, dice of different dimensions do not have equal data storage capacity, requiring complex control circuitry.

At least some of the foregoing methods can be adapted to dice having bonding pads on two or more adjacent sides, for example by laterally offsetting the dice in two dimensions as shown in FIG. 5. However, these arrangements do not adequately address the above mentioned drawbacks, such as congestion of bonding wires and higher dice overhanging the bonding pads of lower dice.

Therefore, there is a need for a Multi-Chip Package having a high storage capacity.

There is also a need for a Multi-Chip Package having a low cost of manufacture.

There is also a need for a Multi-Chip Package having a compact arrangement.

There is also a need for a method of manufacturing a Multi-Chip Package in a reduced number of manufacturing steps.

SUMMARY

It is an object of the present invention to address one or more of the disadvantages of the prior art.

It is another object of the present invention to provide a Multi-Chip Package wherein multiple identical chips are stacked on a substrate with bonding pads oriented in opposite directions, and wherein no chip overhangs the bonding pads of any other chip closer to the substrate.

It is another object of the present invention to provide a method of manufacturing a Multi-Chip Package wherein multiple identical dice are stacked on a substrate with bonding pads oriented in opposite directions, and the bonding pads of all the dice are connected to the substrate in a single manufacturing step.

It is another object of the invention to assemble a stack of devices in a single operation and to wire bond all of the stacked devices in a single operation, without the requirement for interposers or placing a limit on the minimum thickness of a die to allow clearance of a bond wire between two dice.

According to a first aspect of the invention, a semiconductor device comprises a substantially planar substrate. A plurality of stacked semiconductor dice are mounted on the substrate. Each die of the plurality of dice has similar dimensions. Each die has a first plurality of bonding pads arranged along a first bonding edge of the die. The plurality of dice includes a first group of dice mounted to the substrate with the first bonding edge of each die oriented in a first direction; and a second group of dice mounted to the substrate with the first bonding edge of each die oriented in a second direction opposite the first direction. Each die of the plurality of dice is laterally offset in the second direction relative to the remaining dice of the plurality of dice by a respective lateral offset distance such that the bonding pads of each die are not disposed between the substrate and any portion of the remaining dice in a direction perpendicular to the substrate. A plurality of bonding wires connects the bonding pads to the substrate.

In a further aspect, the plurality of semiconductor dice further comprises a third group of dice mounted to the substrate with the first bonding edge of each die oriented in a third direction different from the first and second directions; and a fourth group of dice being mounted to the substrate with the first bonding edge oriented in a fourth direction opposite the third direction. The third and fourth directions are each oriented at 90 degrees relative to the first and second directions.

In a further aspect, the plurality of dice are mounted on the substrate in alternating orientations, such that each pair of adjacent dice includes one die from the first group and one die from the second group.

In a further aspect, each die further includes a second plurality of bonding pads arranged along a second bonding edge.

In a further aspect, the first direction is opposite the second direction. The second bonding edge of each of the first group of dice is oriented in a third direction different from the first and second directions. The second bonding edge of each of the second group of dice is oriented in a fourth direction opposite the third direction.

In a further aspect, the first group of dice comprises m dice. The second group of dice comprises n dice. A first die of the first group of dice is the closest die to the substrate. The lateral offset distance $\Delta_i$ of an ith die from the substrate of the first group of dice is $\Delta_i=(i-1)d$. The lateral offset distance $\Delta_j$ of a jth die from the substrate of the second group of dice is $\Delta_j=[m+(n-j)]d$, where d is a lateral width of the first plurality of bonding pads of each die in the second direction.

In an additional aspect, a method of manufacturing a semiconductor device comprises providing a substrate having a plurality of electrical connections and mounting a first semiconductor die from a first group of dice to the substrate such that a first plurality of bonding pads arranged along a first bonding edge of the first die is oriented in a first direction. The remaining dice from the first group of semiconductor dice are mounted to the substrate such that: a first plurality of bonding pads arranged along a first bonding edge of each of the first group of dice is oriented in the first direction; and each remaining die of the first group of dice is laterally offset relative to the first die in a second direction opposite the first direction by a respective lateral offset distance. A second group of semiconductor dice is mounted to the substrate such that: a first plurality of bonding pads arranged along a first bonding edge of each of the second group of dice is oriented in the second direction; and each die of the second group of dice is laterally offset relative to the first die in the second direction by a respective lateral offset distance. Bond wires are connected between the substrate and the bonding pads of the first and second groups of semiconductor dice after mounting the first and second groups of semiconductor dice to the substrate.

In a further aspect, the respective lateral offset distance of each of the semiconductor dice is selected such that the bonding pads of each die are not disposed between the substrate and any portion of the remaining dice in a direction perpendicular to the substrate.

In a further aspect, the first group of dice comprises m dice; the second group of dice comprises n dice; the lateral offset distance $\Delta_i$ of an ith die from the substrate of the first group of dice is $\Delta_i=(i-1)d$; and the lateral offset distance $\Delta_j$ of a jth die from the substrate of the second group of dice is $\Delta_j=[m+(n-j)]d$.

In a further aspect, mounting the second group of semiconductor dice to the substrate is performed after the remaining dice from the first group of semiconductor dice are mounted to the substrate.

In a further aspect, mounting first and second groups of semiconductor dice to the substrate comprises mounting the semiconductor dice in alternating orientations, such that each die is adjacent only to dice having the opposite orientation.

In a further aspect, the method comprises mounting a third group of semiconductor dice to the substrate such that: a first plurality of bonding pads arranged along a first bonding edge of each of the third group of dice is oriented in a third direction distinct from the first and second directions. A fourth group of semiconductor dice is mounted to the substrate such that: a first plurality of bonding pads arranged along a first bonding edge of each of the second group of dice is oriented in a fourth direction opposite the third direction; and each die of the fourth group of dice is laterally offset in the fourth direction by a respective lateral offset distance relative to the one of the third group of dice closest to the substrate. Connecting bond wires further comprises connecting bond wires between the substrate and the bonding pads of the third and fourth groups of semiconductor dice. Connecting the bond wires is performed after mounting the third and fourth groups of semiconductor dice to the substrate.

In a further aspect, the third and fourth directions are oriented at 90 degrees relative to the first and second directions.

Additional and/or alternative features, aspects, and advantages of embodiments of the present invention will become apparent from the following description, the accompanying drawings, and the appended claims.

DETAILED DESCRIPTION

Figure 1:
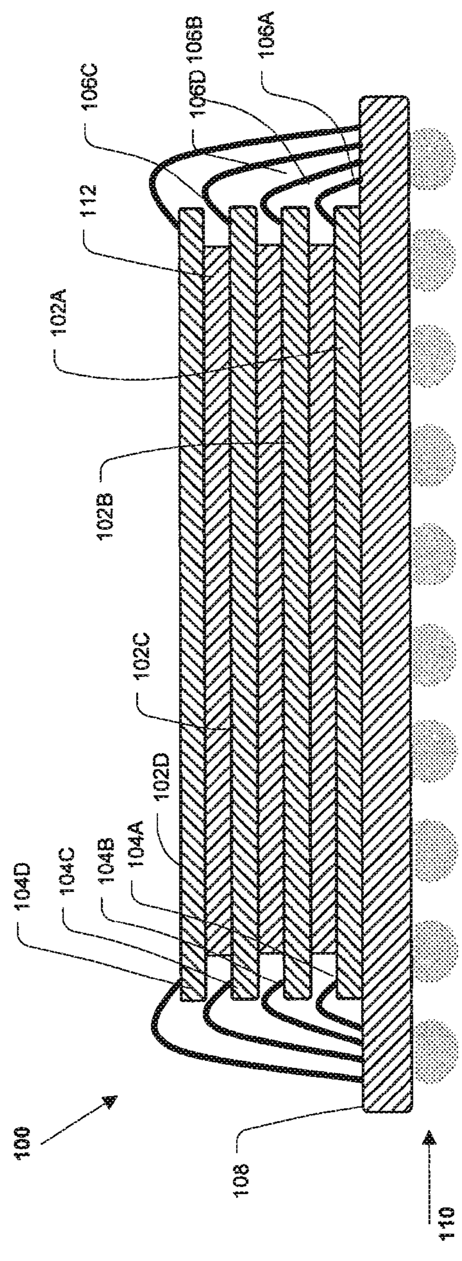
FIGS. 1 to 4 are schematic cross-sectional views of Multi-Chip Packages (MCP) according to various prior art embodiments.
Figure 2:
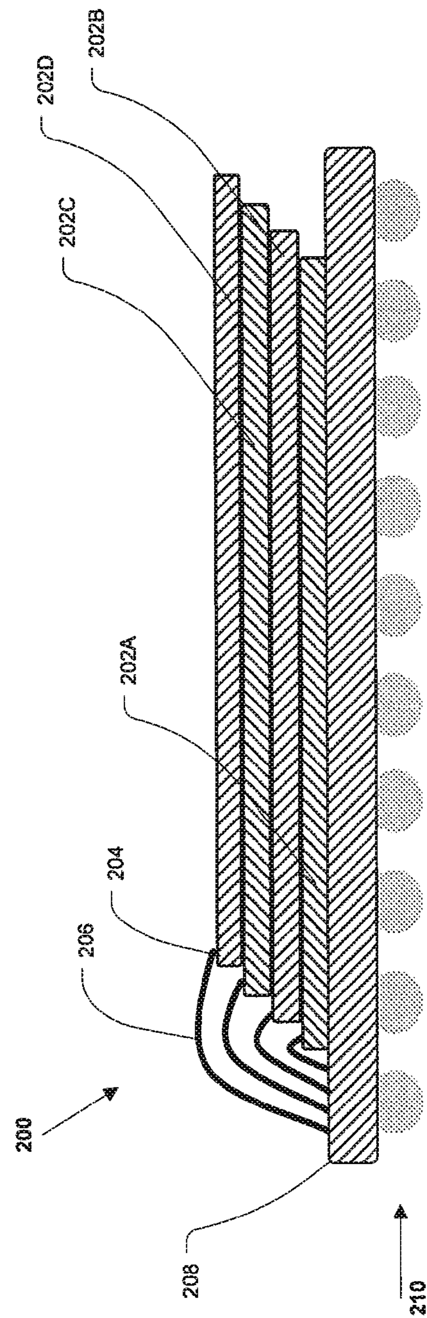
Figure 3:
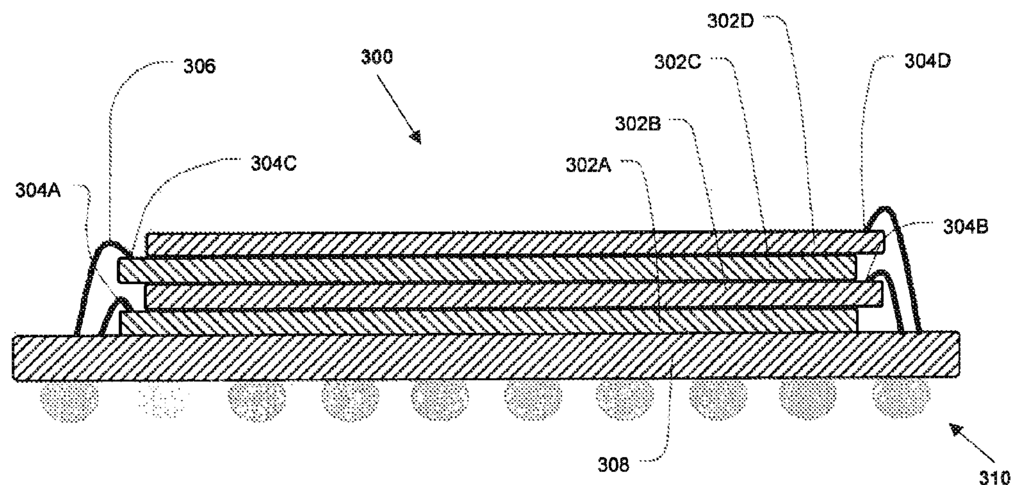
Figure 4:
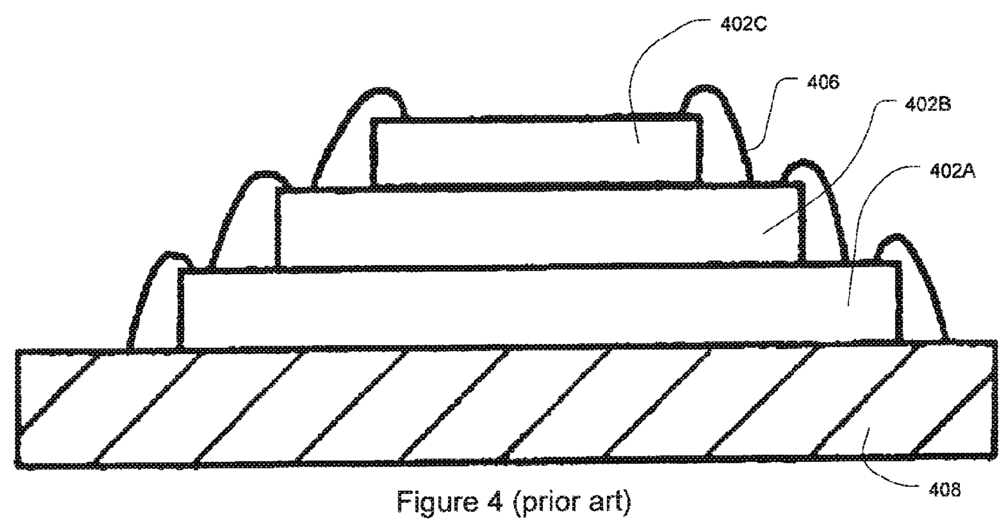
Figure 5:
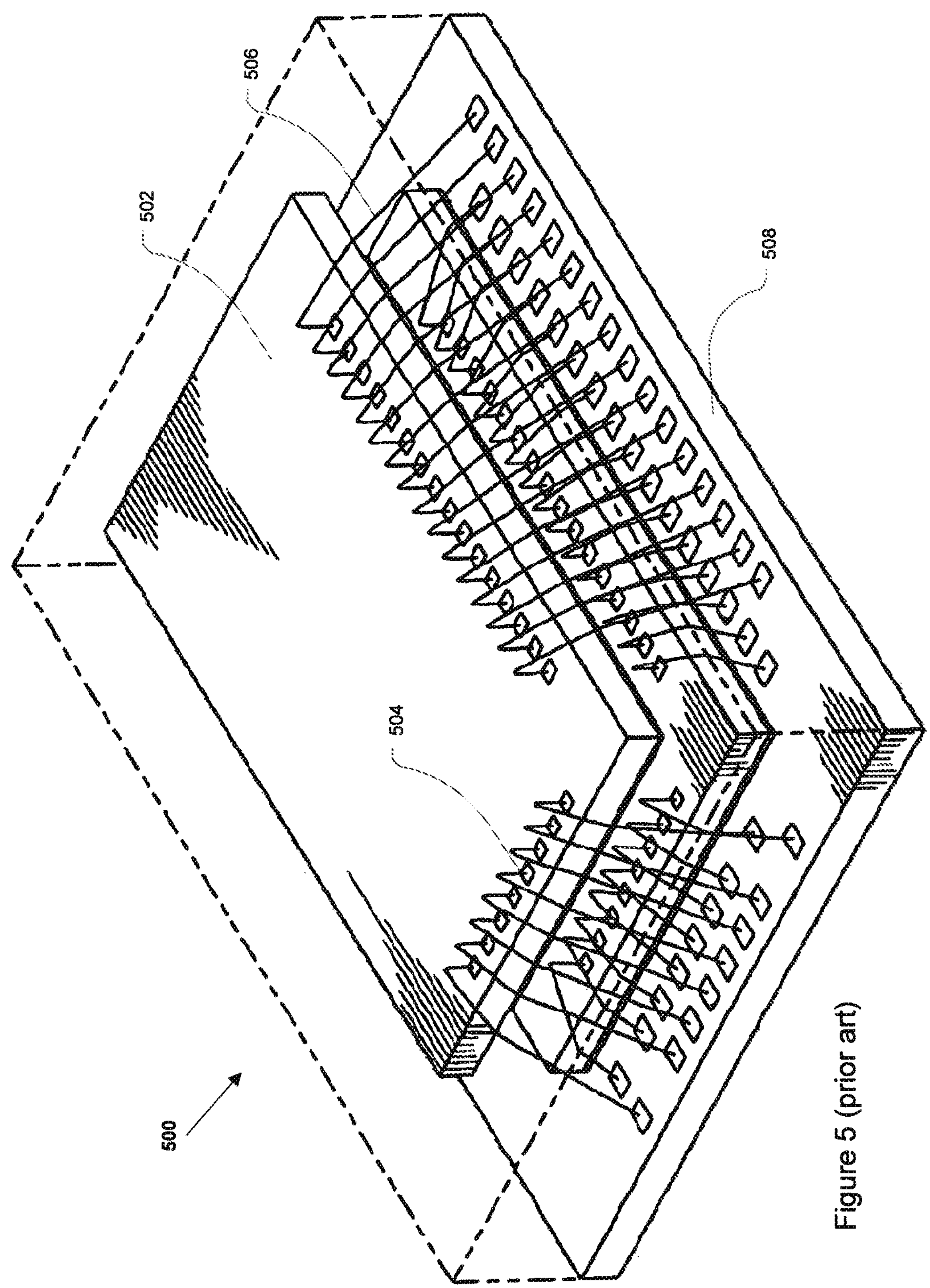
FIG. 5 is a perspective view of a multi-chip package according to a prior art embodiment.
Figure 6:
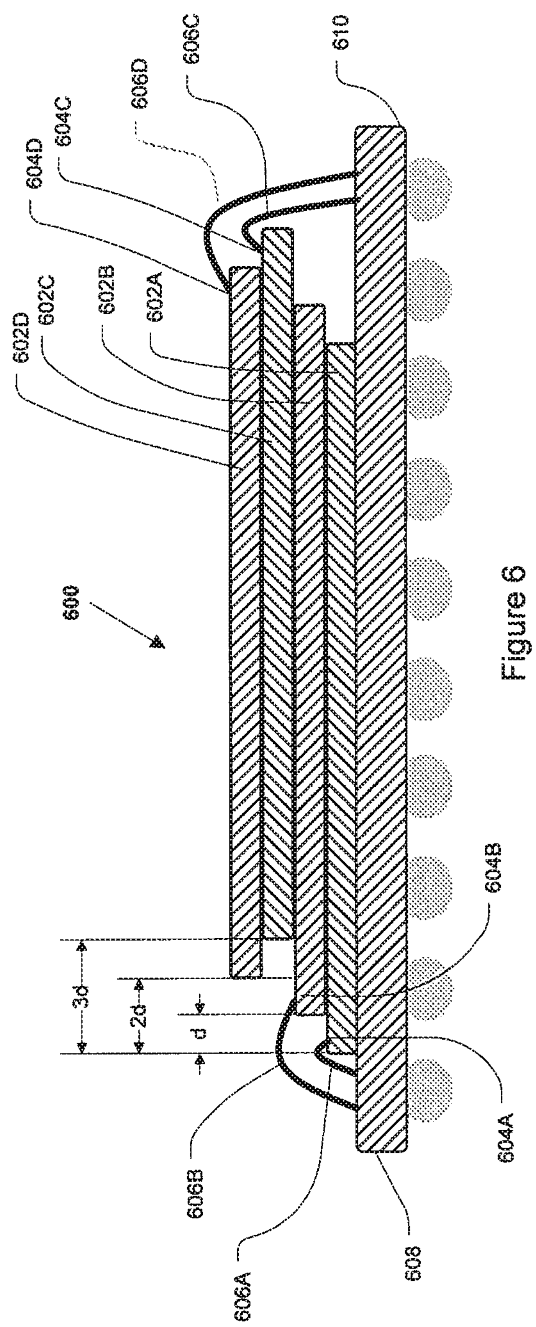
FIG. 6 is a schematic cross-sectional view of an MCP according to a first embodiment.
Figure 8:
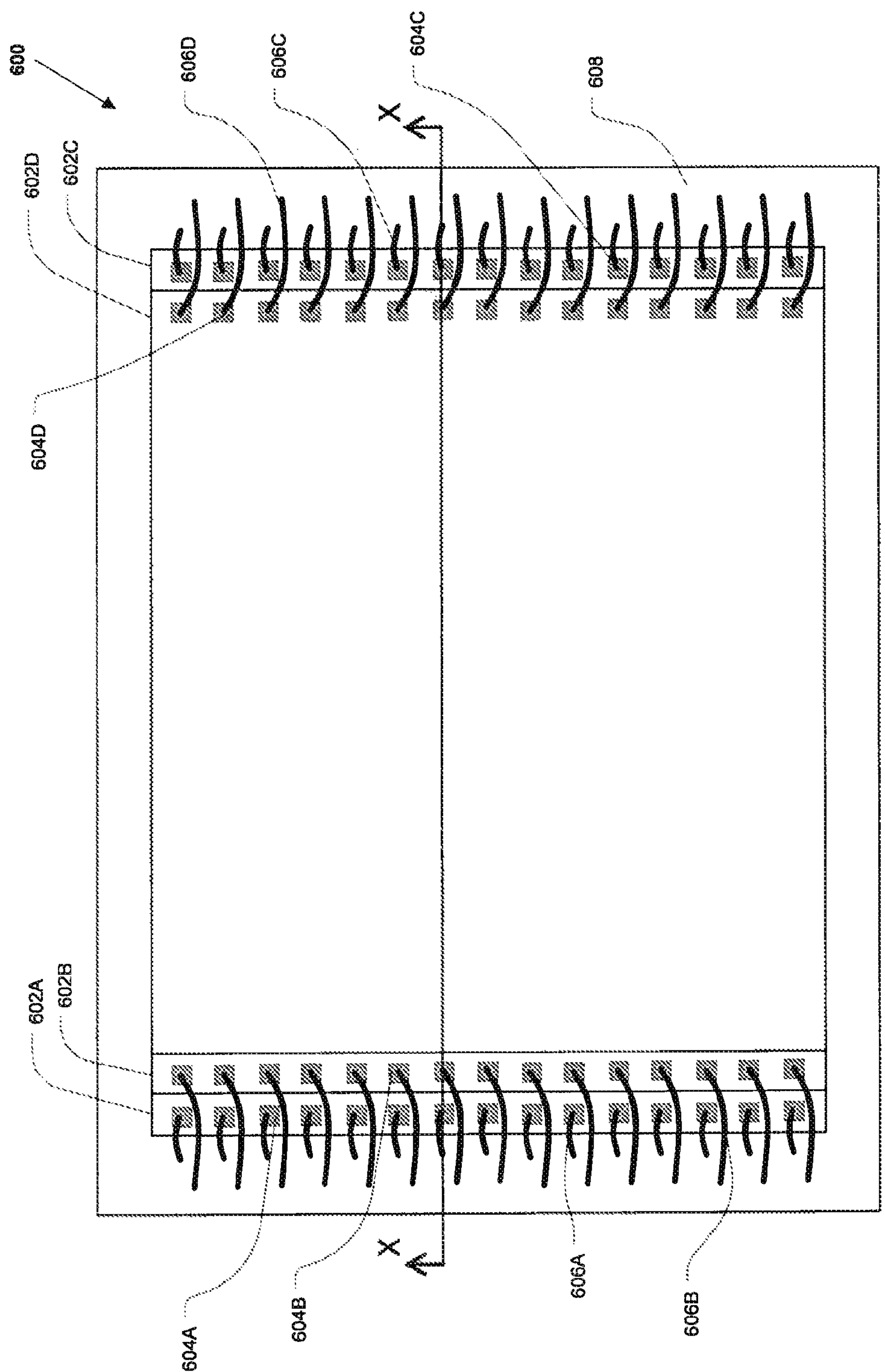
FIG. 8 is a schematic top plan view of the MCPs of FIGS. 6 and 7.

Referring to FIGS. 6 and 8, an MCP 600 according to a first embodiment has four dice 602A, 602B, 602C, 602D. Each die may be a memory chip, such as a NAND Flash chip, of the same dimensions and storage capacity. It should be understood that the structures and methods described herein are equally applicable to other types of memory devices, and are not limited to die stacks of any particular height. Each die 602A, 602B, 602C, 602D has bonding pads 604A, 604B, 604C, 604D, connected to one surface of the substrate 608 via respective bond wires 606A, 606B, 606C, 606D. A plurality of solder balls 110 on the opposite surface of the substrate 608 form a Ball Grid Array (BGA) for connection to an external device. The number and position of the solder balls 110 is known in the art and forms no part of the invention. It is contemplated that other known methods of connecting the MCP to an external device may alternatively be used.

Referring to FIG. 8, with reference to the lateral position of the bottom die 602A, each of the dice 602B, 602C, 602D is laterally offset by a respective offset distance $\Delta_B$, $\Delta_C$, $\Delta_D$. The distances $\Delta$ are sufficient that the dice 602C, 602D do not overhang the bonding pads 604A, 604B, thereby permitting attachment of the bond wires 606A, 606B, 606C, 606D of all four dice 602A, 602B, 602C, 602D in a single manufacturing step after all of the dice 602A, 602B, 602C, 602D have been stacked on the substrate 608. The offset distance $\Delta_B$ is a distance d sufficient to expose the bonding pad 604A and allow access by a wire bonding machine (not shown) for attaching the bond wires 606A. The distance d is typically in the range of a few hundred micrometers, but it should be understood that the distance d may vary for different types of die or methods of connection. The offset distance $\Delta_C$ is a distance $3d$ and the offset distance $\Delta_D$ is a distance $2d$, so that the die 602D exposes the bonding pad 604C, and the dice 602C, 602D do not overhang either of the bonding pads 604A, 604B. This arrangement permits a wire bonding machine to have unobstructed access to all of the bonding pads 604 at once, and thereby to attach all of the bond wires 606 in a single manufacturing step after all of the dice 602 have been stacked on the substrate 608. This arrangement additionally does not require the thickness of the dice 602 to provide sufficient clearance for the bond wires 606, thereby allowing the dice 602 to be manufactured as thinly as technology permits, and reducing the height of the stack accordingly. In addition, it should be understood that the interconnect density on the substrate is reduced by connecting some of the bond wires 606 to the substrate on each side of the dice 602, thereby correspondingly reducing congestion and the difficulties associated therewith. The method of assembly of the MCP 600 will be described below in further detail.

Figure 7:
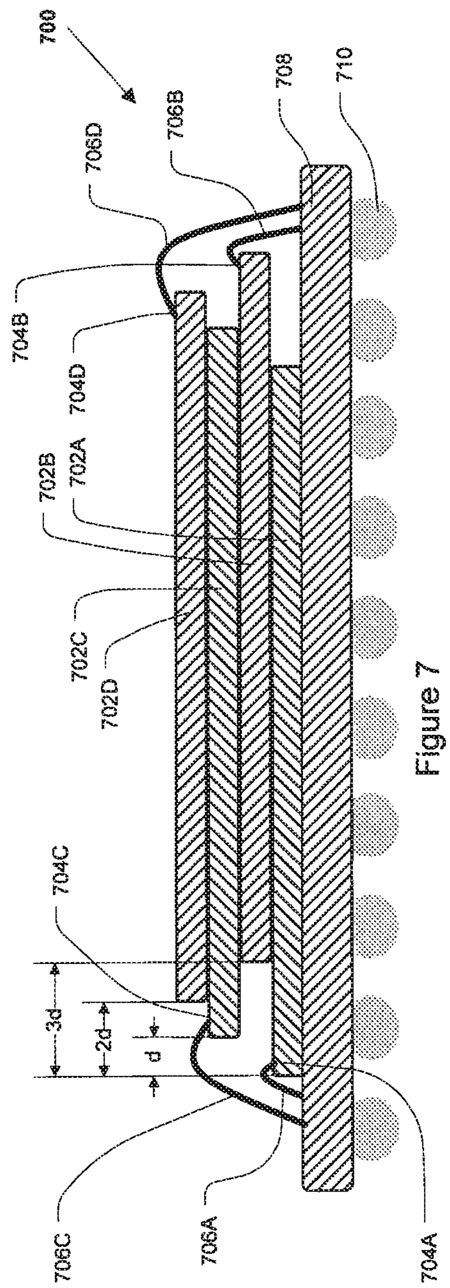
FIG. 7 is a schematic cross-sectional view of an MCP according to a second embodiment.

Referring to FIG. 7, an MCP 700 according to a second embodiment has four dice 702A, 702B, 702C, 702D. The MCP 700 differs from MCP 600 of FIG. 6 in that the dice 702A, 702B, 702C, 702D are stacked in alternating orientations, such that a die 702 with bonding pads 704 facing in one direction is adjacent to dice 702 with bonding pads 704 facing in the opposite direction. The top view of the MCP 700 is the same as the top view of the MCP 600 of FIG. 6, and can be seen in FIG. 8. Similarly to the embodiment of FIG. 6, the die 702B is offset by a distance $\Delta_B$=d relative to the die 702A, the die 702C is offset by a distance $\Delta_C$=$3d$, and the die 702D is offset by a distance $\Delta_D$=$2d$. As a result, no die 702 overhangs the bonding pads 704 of a lower die 702. This arrangement permits a wire bonding machine to have unobstructed access to all of the bonding pads 704 at once, and thereby to attach all of the bond wires 706 in a single manufacturing step after all of the dice 702 have been stacked on the substrate 708. This arrangement additionally does not require the thickness of the dice 702 to provide sufficient clearance for the bond wires 706, thereby allowing the dice 702 to be manufactured as thinly as technology permits, and reducing the height of the stack accordingly. In addition, it should be understood that the interconnect density on the substrate is reduced by connecting some of the bond wires 706 to the substrate on each side of the dice 702, thereby correspondingly reducing congestion and the difficulties associated therewith. In this arrangement, the dice 702 having the same orientation are spaced apart due to the alternating dice 702 in the opposite orientation, providing some additional spacing between the bond wires 706 and consequent reduced susceptibility to shorting compared to the embodiment of FIG. 6. However, this spacing comes at the expense of the mechanical support afforded to each die 702 by its neighboring dice, as a greater length of each die 702 extends past the edges of the dice 702 above and below, compared to the embodiment of FIG. 6. The method of assembly of the MCP 700 will be described below in further detail.

Figure 9:
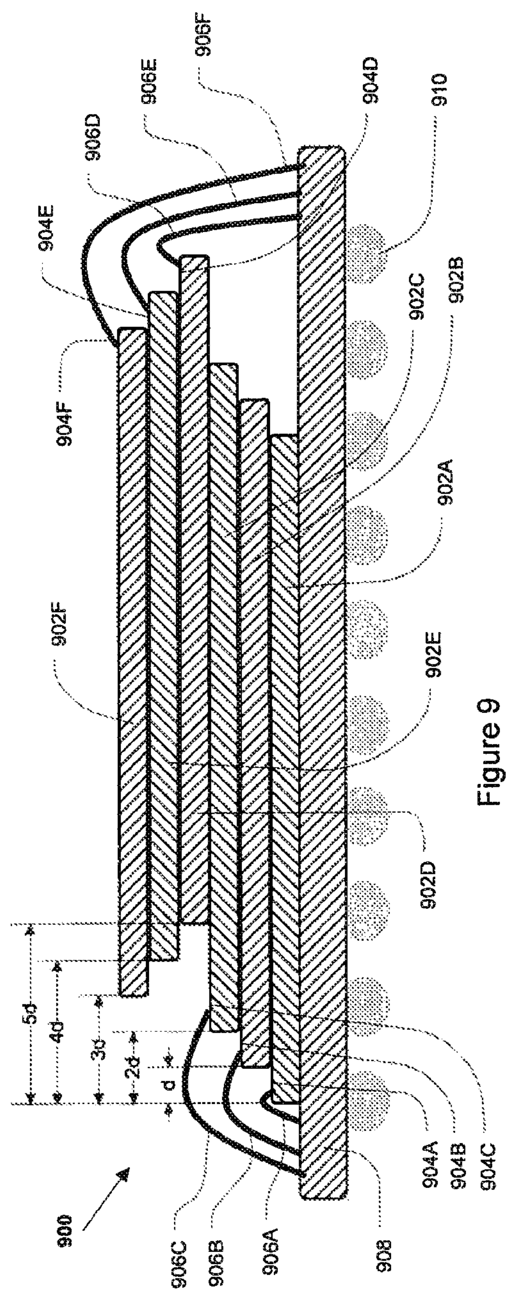
FIG. 9 is a schematic cross-sectional view of an MCP according to a third embodiment.

Referring to FIG. 9, an MCP 900 according to a third embodiment has six dice 902A, 902B, 902C, 902D, 902E, 902F. The MCP 900 differs from the MCP 600 of FIG. 6 by the addition of one additional die 902 in each orientation. In this configuration, the lateral offsets $\Delta_B$ of the respective dice 902B, 902C, 902D, 902E, 902F with respect to the die 902A are as follows:

| Die | Lateral offset distance |
|---|---|
| 902A | 0 (reference position) |
| 902B | d |
| 902C | 2d |
| 902D | 5d |
| 902E | 4d |
| 902F | 3d |

It is contemplated that a greater number of dice 902 could be stacked in each orientation if permitted by the desired final height of the MCP 900, and that the number of dice 902 in each orientation need not be equal.

Figure 10:
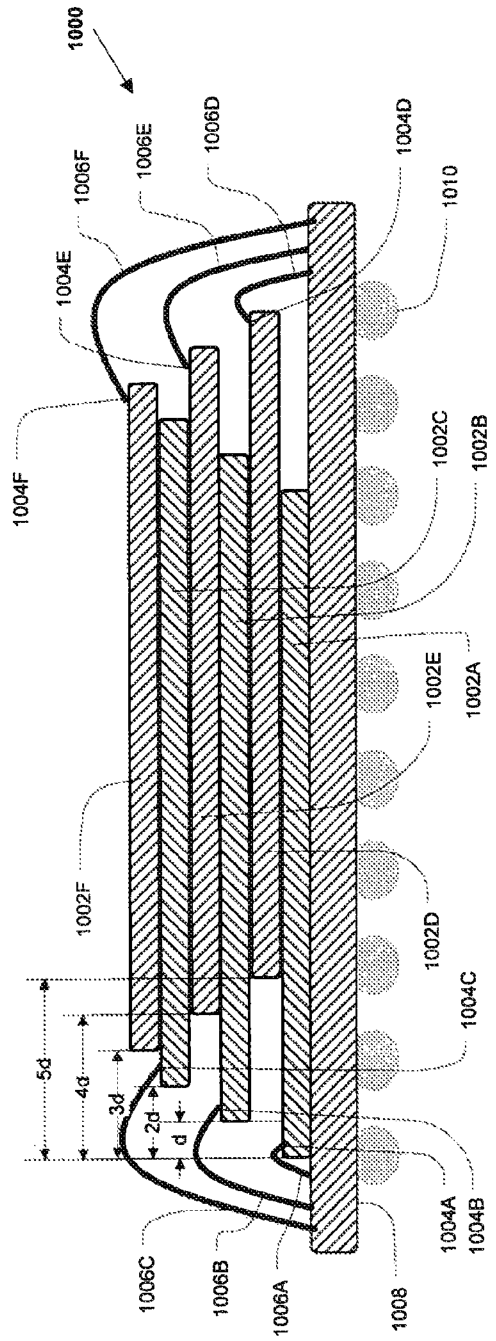
FIG. 10 is a schematic cross-sectional view of an MCP according to a fourth embodiment.

Referring to FIG. 10, an MCP 1000 according to a third embodiment has six dice 1002A, 1002B, 1002C, 1002D, 1002E, 1002F. The MCP 1000 differs from the MCP 700 of FIG. 7 by the addition of one additional die 1002 in each orientation. In this configuration, the lateral offsets Δ of the respective dice 1002B, 1002C, 1002D, 1002E, 1002F with respect to the die 1002A are as follows:

| Die | Lateral offset distance |
|---|---|
| 1002A | 0 (reference position) |
| 1002B | d |
| 1002C | 2d |
| 1002D | 5d |
| 1002E | 4d |
| 1002F | 3d |

It is contemplated that a greater number of dice 1002 could be stacked in each orientation if permitted by the desired final height of the MCP 1000, and that the number of dice 1002 in each orientation need not be equal.

The appropriate offset distance Δ for each die in the MCP, relative to the reference position of the bottom die, can be generalized in terms of the unit offset d for any number of equal-sized dice in each orientation. The offset $\Delta_i$ for the ith of m dice in the same orientation as the bottom die and the offset $\Delta_j$ for the jth of n dice in the opposite orientation of the bottom die are as follows:

$$\Delta_i=(i-1)d \quad \text{(Equation 1)=}$$

$$\Delta_j=[m+(n-j)]d \quad \text{(Equation 2)}$$

In particular, it should be understood from the above equations, the uppermost (mth) die in the same orientation as the bottom die would have an offset of $\Delta_m$=(m−1)d, and the uppermost (nth) die in the opposite orientation would have an offset of $\Delta_n$=md. In this arrangement, the uppermost dice in each orientation have an offset of d relative to each other and neither would overhang the bonding pads of the other. It should also be understood that the offset of each die is independent of whether the dice of the same orientation are all stacked consecutively (as in the MCP 900 of FIG. 9), alternated with dice of the opposite orientation (as in the MCP 1000 of FIG. 10), or in any other permutation.

Figure 11:
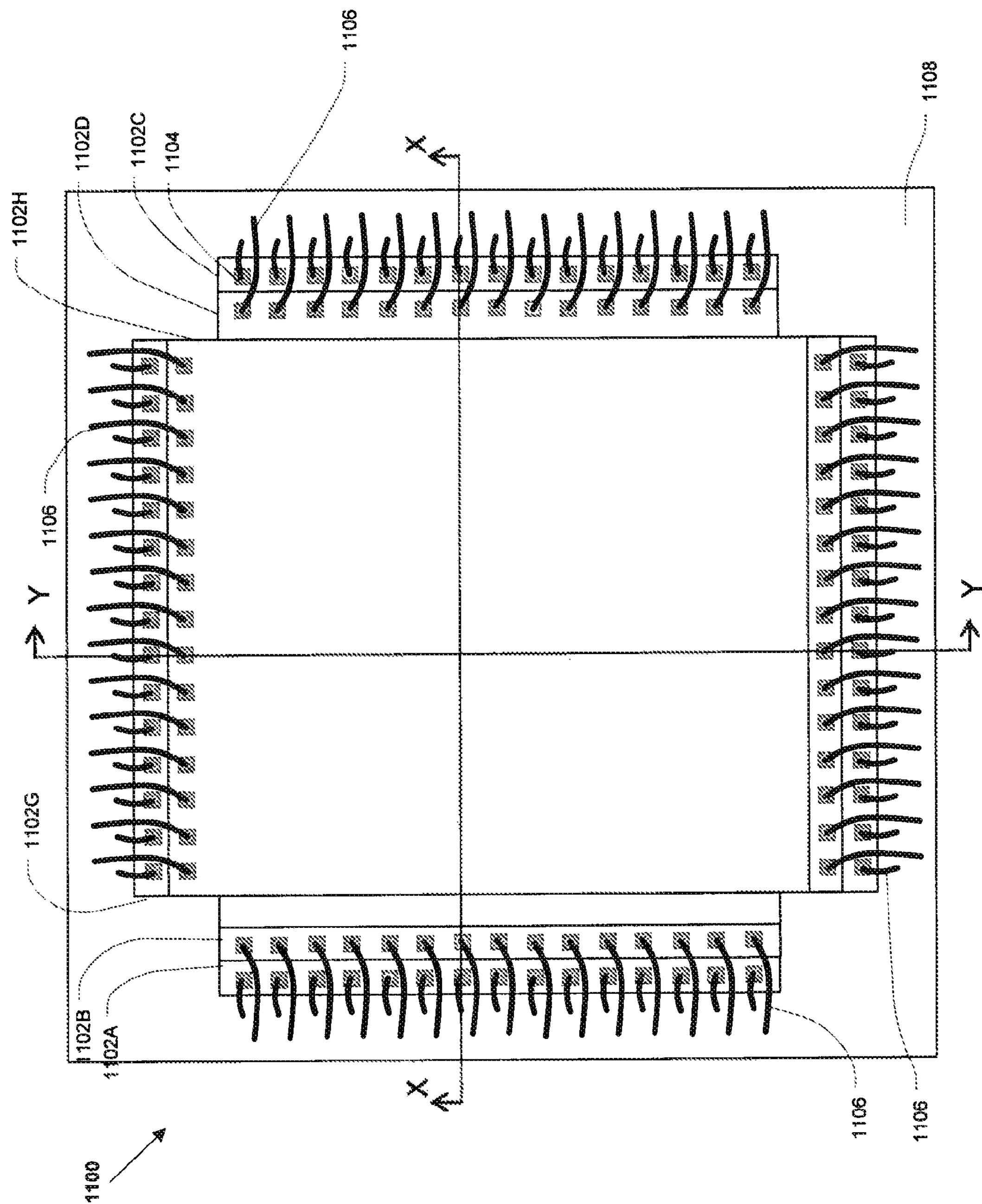
FIG. 11 is a schematic top plan view of an MCP according to a fifth embodiment.

Referring now to FIG. 11, the MCP 1100 has an alternate arrangement wherein eight dice 1102 are arranged with the respective bonding pads 1104 in four different orientations. This arrangement distributes the bond wires 1106 along four sides of the MCP 1100, and thereby allows the use of a greater number of dice 1102 without correspondingly increasing the density of the bond wires 1106. In this embodiment, dice 1102A, 1102B, 1102C, 1102D (collectively, the sub-stack 1114) may be arranged relative to each other in the same way as the dice 602A, 602B, 602C, 602D of FIG. 6, or the dice 702A, 702B, 702C, 702D of FIG. 7, or in some other arrangement such as with die 1102C as the bottom die and 1102D as the top die. The dice 1102E, 1102F, 1102G, 1102H (collectively, the sub-stack 1116) are similarly arranged relative to each other, and are oriented at a right angle with respect to the sub-stack 1114. It is contemplated that the sub-stack 1114 may be arranged either above or below the sub-stack 1116. It is further contemplated that the dice 1102A, 1102B, 1102C, 1102D, 1102E, 1102F, 1102G, 1102H may be stacked in any alternative order, provided that the appropriate lateral offsets as discussed above are maintained between the dice in each respective sub-stack. It is further contemplated that each sub-stack 1114, 1116 may have more than two dice 1102 with bonding pads 1104 in either or both of the two orientations, for example as shown in FIGS. 9 and 10.

Figure 12:
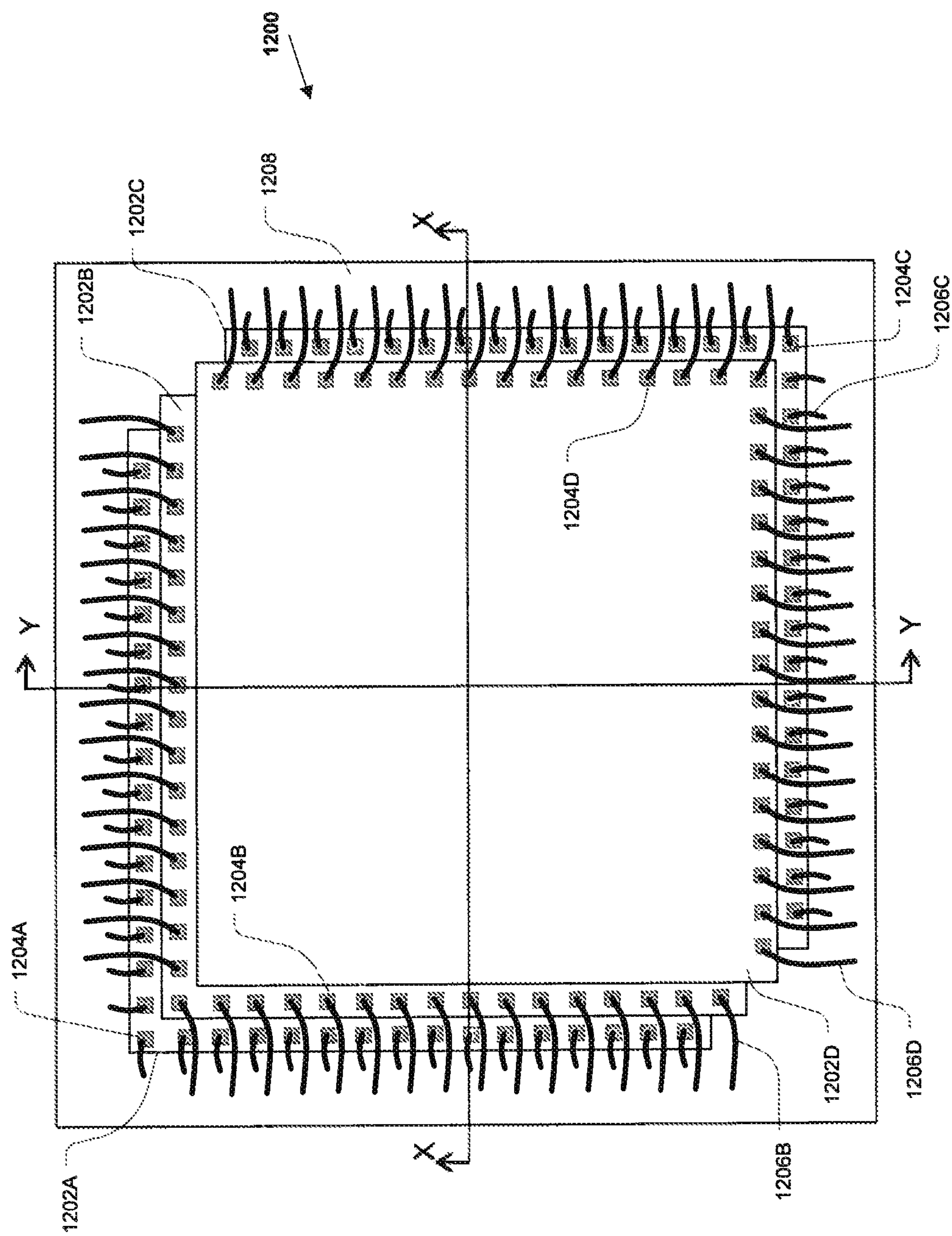
FIG. 12 is a schematic top plan view of an MCP according to a sixth embodiment.

Referring to FIG. 12, the MCP 1200 has four dice 1202A, 1202B, 1202C, 1202D. The MCP 1200 differs from the MCP 600 of FIG. 6 and the MCP 700 of FIG. 7 in that the dice 1202 each have bonding pads 1204 on two adjacent sides, with the bonding pads 1204 connected to the substrate 1208 via bond wires 1206 along those two sides. Dice 1202A and 1202B have their bonding pads 1204A, 1204B oriented in the same two directions, and dice 1202C and 1202D have their bonding pads 1204C, 1204D oriented in the two opposite directions. The dice 1202C and 1202D can therefore be considered to be rotated 180° with respect to the dice 1202A and 1202B. The dice 1202B, 1202C, 1202D are offset in two directions relative to the bottom die 1202A to prevent overhanging the bonding pads 1204 of the lower dice 1202. The offset in each direction is determined in the same manner as for the MCP 600 of FIG. 6 or the MCP 700 of FIG. 7. Depending on the order in which the dice 1202 are stacked on the substrate 1208, the cross-sectional views in the directions X-X and Y-Y of the MCP 1200 may look like either FIG. 6 or FIG. 7.

Figure 13:
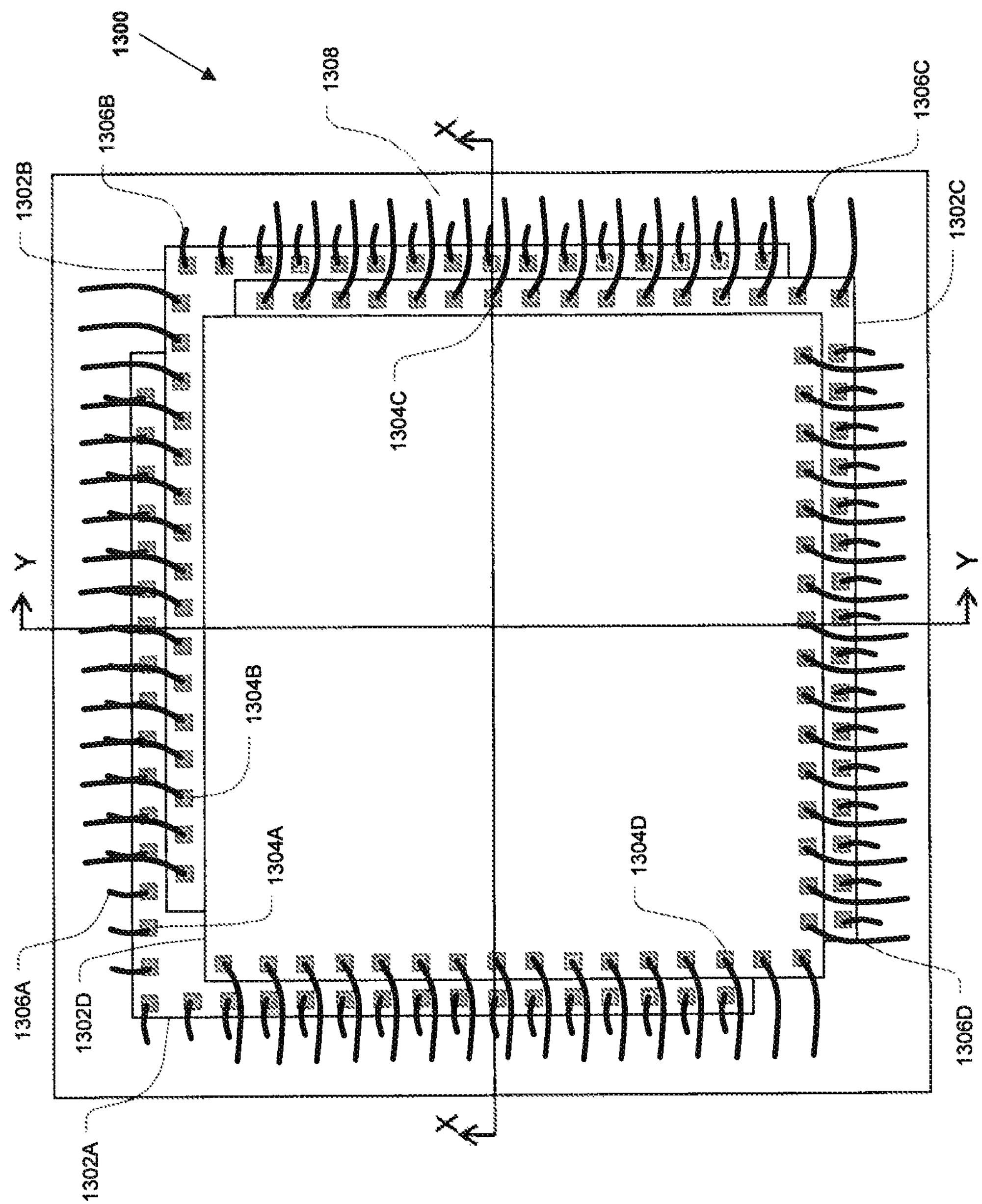
FIG. 13 is a schematic top plan view of an MCP according to a seventh embodiment.

Referring to FIG. 13, the MCP 1300 has four dice 1302A, 1302B, 1302C, 1302D, each have bonding pads 1304 on two adjacent sides, with the bonding pads 1304 connected to the substrate 1308 via bond wires 1306 along those two sides. The MCP 1300 differs from the MCP 1200 of FIG. 12 in that the dice 1302 are not arranged in two groups each having a common orientation. In this arrangement, while the lateral offset of each die 1302 relative to the bottom die 1302A is determined in the same manner as for the MCP 600 of FIG. 6 or the MCP 700 of FIG. 7, the x-axis and y-axis offsets for each die 1302 relative to the die 1302A are determined independently of each other. Taking the die 1302C as an example, when viewed in the X-X direction, the die 1302C is the second-lowest die with bonding pads oriented opposite those of the bottom die 1302A. This position corresponds to j=2, giving an offset of **2*d* in this direction according to Equation 2. When viewed in the Y-Y direction, the die 1302C is the lowest die with bonding pads oriented opposite those of the bottom die 1302A. This position corresponds to j=1, giving an offset of 3*d* in this direction according to Equation 2. The offsets of the remaining dice 1302B and 1302D can be determined in a similar manner. Depending on the order in which the dice 1302 are stacked on the substrate 1308, and the orientation chosen for each die 1302, the cross-sectional views along the lines X-X and Y-Y of the MCP 1300 may or may not look like either FIG. 6 or FIG. 7**.

Figure 14:
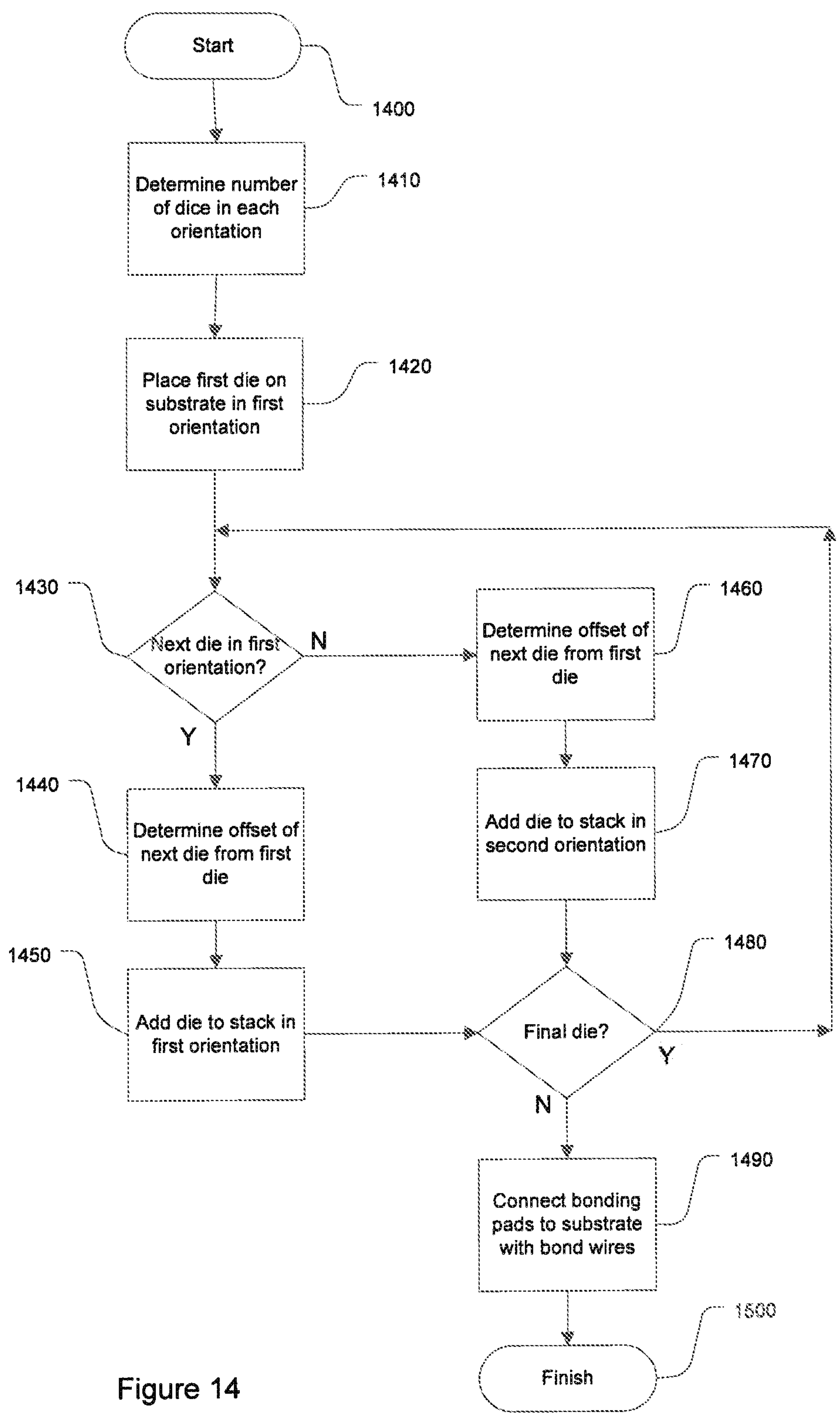
FIG. 14 is a logic diagram of a method of assembly of an MCP according to a further embodiment.

Referring now to FIG. 14, a method of assembling a multi-chip package will be described, starting at step 1400.

At step 1410, the number of dice to be stacked in each orientation is determined. The total number of dice may be determined based on the desired storage capacity of the resulting MCP, the maximum total height of the resulting stack, cost considerations, or any other suitable criteria. It may be advantageous for the number of dice m in the first orientation to be approximately equal to the number of dice n in the second orientation, to provide a more even distribution of bond wires and electrical connections to the substrate. However, die stacks with more dice in one orientation and fewer dice in another orientation (either m>n or n>m) are also contemplated. For ease of reference, the first orientation is defined herein as the orientation of the first die to be placed on the substrate. It should be understood that this does not limit the generality of the method. It should be understood that if each die has bonding pads on two adjacent sides, the orientations in each of two perpendicular dimensions are considered independently of each other. Thus, the determination of m and n is made independently in each dimension. The process continues at step 1420.

At step 1420, the first die is placed on the substrate, and adhered thereto in any suitable manner. The process continues at step 1430.

At step 1430, the orientation of the next die to be added to the stack is determined, relative to the orientation of the first die. If the next die has bonding pads on two adjacent sides, the orientation of each of the two adjacent sides is independently compared to the corresponding side of the first die, to determine whether the bonding pads of the next die are in the first orientation or the second (opposite) orientation. If the next die is in the first orientation, the process continues at step 1440. If the next die is in the second orientation, the process continues at step 1460. If the next die has bonding pads along two adjacent sides, the process may continue at step 1440 with respect to one of the adjacent sides and at step 1460 with respect to the other adjacent side, as appropriate.

At step 1440, the offset distance between the first die and the next die is determined. The determination may be on the basis of Equation 1, corresponding to dice in the first orientation. The determination may alternatively be made in any other suitable manner, for example by providing a single unit offset d relative to the most recently-stacked die of the first orientation, thereby implicitly satisfying Equation 1, or by providing the next die with a sufficient offset that it does not overhang a bonding pad of any lower die. It is further contemplated that the offset distance may be determined in advance and stored in a memory device, for example if multiple MCPs are being assembled according to the same specifications. The process continues at step 1450.

At step 1450, the next die is added to the stack in the position determined at step 1440, and adhered thereto in any suitable manner. The process continues at step 1480.

At step 1460, the offset distance between the first die and the next die is determined.

The determination may be on the basis of Equation 2, corresponding to dice in the second orientation. The determination may alternatively be made in any other suitable manner, for example by providing a single unit offset −d relative to the most recently-stacked die of the second orientation, thereby implicitly satisfying Equation 1, or by providing the next die with a sufficient offset that it does not overhang a bonding pad of any lower die. It is further contemplated that the offset distance may be determined in advance and stored in a memory device, for example if multiple MCPs are being assembled according to the same specifications. The process continues at step 1470.

At step 1470, the next die is added to the stack in the position determined at step 1460, and adhered thereto in any suitable manner. The process continues at step 1480.

At step 1480, if the most recent die that was added to the stack is the final die to be added, the stacked die arrangement is completed and the process continues at step 1490. If the most recent die that was added to the stack is not the final die to be added, the process returns to step 1430 to add another die.

At step 1490, a wire bonding machine connects bonding wires to all of the dice in the completed stack to provide electrical connections to the substrate. The bonding wires can all be attached in a single manufacturing step because the relative offsets between the dice in the completed stack are such that every bonding pad of every die in the stack is accessible from above by the wire bonding machine and unobstructed by the dice above.

At step 1500, the process ends and the MCP is ready for further processing, including encapsulating the dice and bonding wires in a protective plastic moulding compound or sealing the package by some other suitable method.

Modifications and improvements to the above-described embodiments of the present invention may become apparent to those skilled in the art. The foregoing description is intended to be exemplary rather than limiting. The scope of the present invention is therefore intended to be limited solely by the scope of the appended claims.

The invention claimed is:

1. A semiconductor device comprising:
a substantially planar substrate;
a plurality of stacked semiconductor dice mounted on the substrate;
each die of the plurality of dice having substantially similar dimensions;
each die having a first plurality of bonding pads arranged along a first bonding edge of the die, the plurality of dice including:
a first group of first dice mounted to the substrate with the first bonding edge of each first die oriented in a first direction; and
a second group of second dice mounted to the substrate with the first bonding edge of each second die oriented in a second direction opposite the first direction;
each die of the plurality of dice being laterally offset in the second direction relative to the remaining dice of the plurality of dice by a respective lateral offset distance such that the bonding pads of each die are not disposed between the substrate and any portion of the remaining dice in a direction perpendicular to the substrate; and
a plurality of bonding wires connecting the first plurality of bonding pads to the substrate.

2. The semiconductor device of claim 1, wherein:
the plurality of semiconductor dice further comprises:
a third group of third dice mounted to the substrate with the first bonding edge of each third die oriented in a third direction different from the first and second directions; and
a fourth group of fourth dice being mounted to the substrate with the first bonding edge of each fourth die oriented in a fourth direction opposite the third direction;
the third and fourth directions each being oriented at 90 degrees relative to the first and second directions.

3. The semiconductor device of claim 1, wherein the plurality of dice are mounted on the substrate with the first bonding edge oriented in alternating orientations, such that each pair of adjacent dice includes one first die and one second die.

4. The semiconductor device of claim 1, wherein: each die further includes a second plurality of bonding pads arranged along a second bonding edge.

5. The semiconductor device of claim 4, wherein:
the first direction is opposite the second direction;
the second bonding edge of each of the first dice is oriented in a third direction different from the first and second directions; and
the second bonding edge of each of the second dice is oriented in a fourth direction opposite the third direction.

6. The semiconductor device of claim 1, wherein:
the first group of dice comprises m first dice;
the second group of dice comprises n second dice;

a first die of the first group of dice being the closest die to the substrate;

the lateral offset distance $\Delta_i$ of an ith die from the substrate of the first group of dice being $\Delta_i=(i-1)d$; and the lateral offset distance $\Delta_j$ of a jth die from the substrate of the second group of dice being $\Delta_j=[m+(n-j)]d$;

where d is a predetermined distance.

7. The semiconductor device of claim 6, wherein d is a lateral width of the first plurality of bonding pads of each die in the second direction.

* * * * *